United States Patent
Jin et al.

(10) Patent No.: US 9,455,241 B2
(45) Date of Patent: Sep. 27, 2016

(54) INTEGRATED CIRCUIT PACKAGE AND METHOD OF FORMING THE SAME

(71) Applicant: STMICROELECTRONICS PTE LTD, Singapore (SG)

(72) Inventors: Yonggang Jin, Singapore (SG); Kiyoshi Kuwabara, Kanagawa (JP); Xavier Baraton, Moirans (FR)

(73) Assignee: STMICROELECTRONICS PTE LTD, Singapore (SG)

( * ) Notice: Subject to any disclaimer, the term of this patent is extended or adjusted under 35 U.S.C. 154(b) by 1 day.

(21) Appl. No.: 14/754,230

(22) Filed: Jun. 29, 2015

(65) Prior Publication Data

US 2015/0303168 A1  Oct. 22, 2015

Related U.S. Application Data

(62) Division of application No. 12/578,382, filed on Oct. 13, 2009, now abandoned.

(60) Provisional application No. 61/147,430, filed on Jan. 26, 2009.

(51) Int. Cl.
  *H01L 23/00* (2006.01)
  *H01L 21/48* (2006.01)
  (Continued)

(52) U.S. Cl.
  CPC ............. *H01L 24/83* (2013.01); *H01L 21/311* (2013.01); *H01L 21/486* (2013.01); *H01L 21/4821* (2013.01); *H01L 21/56* (2013.01); *H01L 21/568* (2013.01); *H01L 21/6835* (2013.01); *H01L 21/768* (2013.01); *H01L 23/49816* (2013.01); *H01L 23/49827* (2013.01); *H01L 23/49894* (2013.01); *H01L 23/5389* (2013.01); *H01L 24/11* (2013.01); *H01L 24/18* (2013.01); *H01L 24/82* (2013.01); *H01L 24/96* (2013.01); *H01L 2221/68345* (2013.01); *H01L 2221/68359* (2013.01); *H01L 2221/68372* (2013.01); *H01L 2221/68377* (2013.01); *H01L 2221/68381* (2013.01); *H01L 2224/18* (2013.01); *H01L 2224/8385* (2013.01); *H01L 2924/01006* (2013.01); *H01L 2924/01013* (2013.01);
  (Continued)

(58) Field of Classification Search
  CPC . H01L 24/83; H01L 21/311; H01L 21/4821; H01L 21/486; H01L 21/56; H01L 21/568; H01L 21/6835; H01L 21/768; H01L 23/49816; H01L 23/49827; H01L 23/49894; H01L 23/5389
  See application file for complete search history.

(56) References Cited

U.S. PATENT DOCUMENTS 5,480,503 A * 1/1996 Casey ................. H01L 21/4857
                                                       156/235
5,556,810 A   9/1996 Fujitsu
(Continued)

*Primary Examiner* — Laura Menz
*Assistant Examiner* — Candice Y Chan
(74) *Attorney, Agent, or Firm* — Allen, Dyer, Doppelt, Milbrath & Gilchrist, P.A.

(57) ABSTRACT

Aspects of the invention are directed towards an integrated circuit package and method of forming the same, and more particularly to a redistributed chip packaging for an integrated circuit. The integrated circuit package includes an integrated circuit having a protective material on at least a portion of the integrated circuit. A lead frame is coupled to the integrated circuit and a conductive layer is also coupled to the interconnect. A solder ball is coupled to the conductive layer and a passivation layer is on the conductive layer. Active and passive components are electrically coupled to the integrated circuit.

16 Claims, 3 Drawing Sheets

(51) Int. Cl.
*H01L 21/683* (2006.01)
*H01L 23/498* (2006.01)
*H01L 23/538* (2006.01)
*H01L 21/311* (2006.01)
*H01L 21/56* (2006.01)
*H01L 21/768* (2006.01)

(52) U.S. Cl.
CPC ............... *H01L2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/09701* (2013.01); *H01L 2924/14* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01)

(56) References Cited

U.S. PATENT DOCUMENTS

| | | | |
|---|---|---|---|
| 7,294,920 | B2 | 11/2007 | Chen et al. |
| 8,067,821 | B1 | 11/2011 | Choi et al. |
| 8,525,314 | B2 | 9/2013 | Haba et al. |
| 2002/0019073 | A1 | 2/2002 | Moon |
| 2009/0026594 | A1* | 1/2009 | Yee ............... H01L 21/4821 257/676 |
| 2010/0176905 | A1 | 7/2010 | Lotfi et al. |

* cited by examiner

INTEGRATED CIRCUIT PACKAGE AND METHOD OF FORMING THE SAME

BACKGROUND OF THE INVENTION

1. Field of the Invention

The invention relates to an integrated circuit package and method of forming the same, and more particularly to a redistributed chip packaging for an integrated circuit.

2. Discussion of the Related Art

With continuously decreasing semiconductor device dimensions and increasing device packaging densities, the packaging of semiconductor devices has continued to gain in importance. In the electronics industry, the continuing goal has been to reduce the size of electronic devices such as in digital cameras and camcorders. Metal interconnects, thereby including points of metal contact solder bumps that connect a semiconductor to surrounding circuits, increasingly become important.

SUMMARY OF THE INVENTION

Accordingly, the present invention is directed to an integrated circuit package and method of forming the same that substantially obviates one or more of the problems due to limitations and disadvantages of the related art.

An advantage of an embodiment of the invention is to provide reduced processing steps for forming a chip packing.

Another advantage of an embodiment of the invention is to provide a reduced cost of forming a chip packing.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, an embodiment of the invention is directed towards an integrated circuit package. The integrated circuit package includes an integrated circuit having a protective material on at least a portion of the integrated circuit. A lead frame is coupled to the integrated circuit and a conductive layer is also coupled to the interconnect. A solder ball is coupled to the conductive layer and a passivation layer is on the conductive layer. Active and passive components are electrically coupled to the integrated circuit.

In another aspect, an embodiment of the invention is directed towards a method of forming an integrated circuit package. The method includes forming a lead frame including a first portion and a second portion. The first portion and the second portion of the lead frame intersect at an angle ranging from about 45 degrees to about 135 degrees. An adhesive material is formed on the first portion of the lead frame and a carrier is attached to the lead frame with the adhesive material. An integrated circuit is also attached to the adhesive material. Interconnects are formed on the integrated circuit and protective material is formed on the integrated circuit.

In another aspect, an embodiment of the invention is directed towards a method of making an integrated circuit package. The method includes forming a lead frame including a first portion and a second portion. The first portion and the second portion of the lead frame intersect at an angle ranging from about 45 degrees to about 135 degrees. A double sided thermal tape is adhered to a bottom surface of the first portion of the lead frame; attaching a carrier to the lead frame with the thermal double-sided thermal tape is also part of the method. The method further includes attaching an integrated circuit to the thermal double-sided adhesive tape adjacent to the first portion of the lead frame and forming at least one pillar interconnect on the integrated circuit. A compressive compound is formed over the integrated circuit as well as over the first and second portions of the lead frame. The compressive compound is hardened by heating the compressive compound to a temperature in the range of about 120° C. to about 150° C.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, an example of which is illustrated in the accompanying drawings.

Figure 1A:
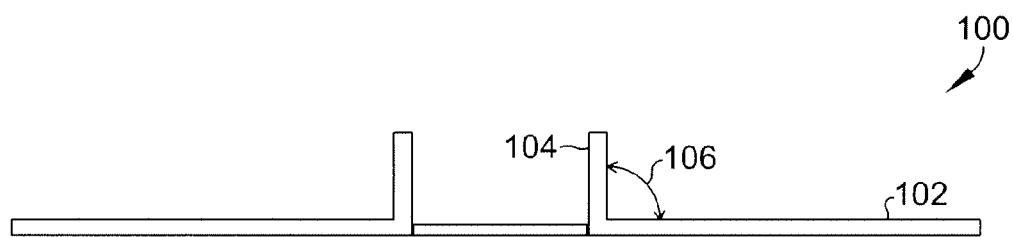
FIG. 1A illustrates a cross-sectional view of manufacturing a lead frame of the integrated circuit package of FIG. 1 according to an embodiment of the invention.

FIG. 1A illustrates a cross-sectional view of manufacturing an integrated circuit package according to an embodiment of the invention.

Figure 1B:
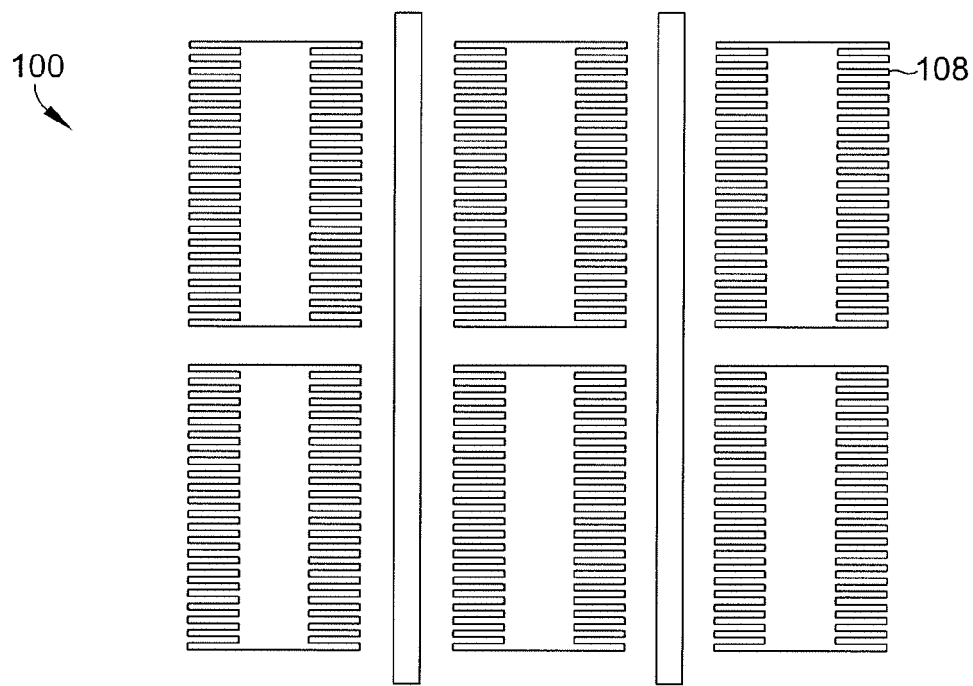
FIG. 1B illustrates a top-down view of the lead frame in FIG. 1A.

FIG. 1A illustrates forming a lead frame 100 having a first portion 102 and a second portion 104. The first portion 102 and the second portion 104 intersect forming an angle 106 ranging from about 45 degrees to about 135 degrees. In a preferred embodiment, the angle ranges from about 85 degrees to about 95 degrees. In a more preferred embodiment, the angle is about 90 degrees. The lead frame 100 comprises a conductive material. The conductive material may be a single material or an alloy material such as aluminum, gold, copper, combinations thereof, and the like. Now referring to FIG. 1B, it shows a top-down view of the lead frame 100. The lead frame is manufactured by forming the conductive material via stamping or etching as known in the art. In a preferred embodiment, the conductive material is stamped to form a plurality of open spaces 108 and bent into the desired angle 106 as shown in FIG. 1A.

Figure 2:
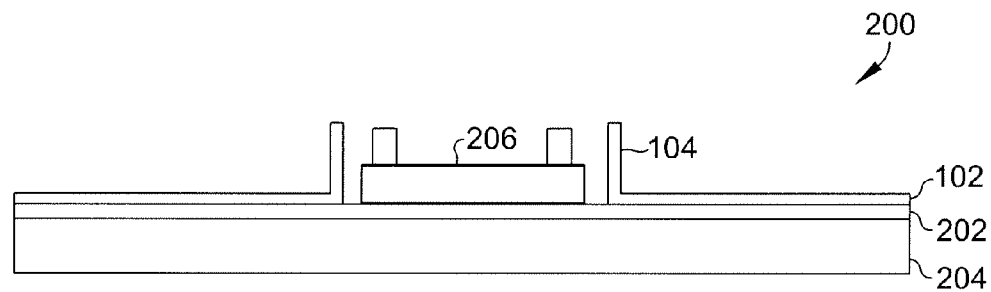
FIG. 2 illustrates a cross-sectional view of an intermediate stage of manufacturing the integrated circuit package of FIG. 1.

FIG. 2 illustrates a cross-sectional view of an intermediate stage of manufacturing the integrated circuit package after forming the lead frame.

Referring to FIG. 2, an adhesive material 202 is formed on the bottom portion of the lead frame 100. In a preferred embodiment, the adhesive material 202 is double-sided thermal release tape such as 3195V by Nitto Denko, Japan. The double-sided thermal release tape is capable of being removed after thermo process at a high temperature ranging from about 175° C. to about 260° C. The adhesive material 202 is attached to a bottom surface of the lead frame and/or a carrier 204; next the carrier 204 is attached to an opposite surface of the adhesive material 202. The carrier 204 is for transportation of the apparatus and may include materials such as plastics, glass (e.g., low temperature CT glass), ceramics, steel, combinations thereof, and the like.

An integrated circuit chip 206 is attached to the adhesive material 202. The integrated circuit chip 206 is arranged between second portions 104 of the lead frame 100. At least one interconnect 208 is formed on the integrated circuit chip 206. In a preferred embodiment, the interconnect 208 includes a conductive material, e.g., copper, gold, pewter, combinations thereof, and the like, formed by plating as known in the art. In a preferred embodiment, the interconnect is a copper pillar bump. Of course, other conductive materials may also be used, such as alloys and the like.

Figure 3:
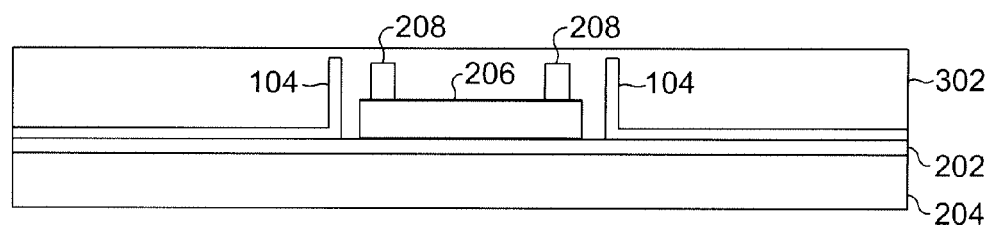
FIG. 3 illustrates a cross-sectional view of an intermediate stage of manufacturing the integrated circuit package of FIG. 1.

FIG. 3 illustrates a cross-sectional view of an intermediate stage of manufacturing the integrated circuit package after attaching a carrier.

Referring to FIG. 3, a protective material 302 is formed over the structure in FIG. 2. The protective material is an encapsulant of material such as epoxy, plastic, polymers, combinations thereof, and the like. In a preferred embodiment, the protective material is an epoxy compressive molding compound. The protective material may either come in powder or liquid form. If in powder form, the powder needs to be processed before applying. The compressive molding compound is capable of being hardened during a molding process. In this embodiment, a mold (not shown) is affixed from the top and bottom and heated for the desired time and to the desired temperature to harden the protective material. After which, the mold is released, thereby forming a hardened protective material 302.

In a preferred embodiment, the hardening process includes heating the compound to a temperature ranging from about 120° C. to about 150° C. for a time ranging from about 2 to about 10 minutes. Also, in the preferred embodiment, the epoxy part is R4212 epoxy molding compound from Nagase Corp. of Japan.

Figure 4:
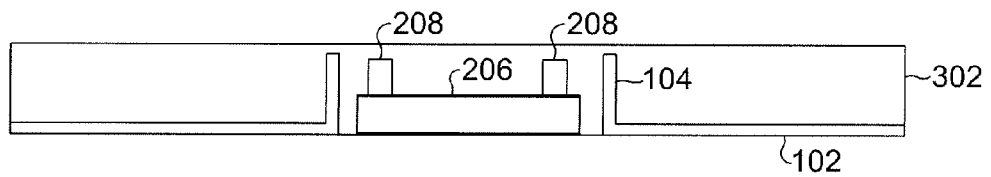
FIG. 4 illustrates a cross-sectional view of an intermediate stage of manufacturing the integrated circuit package of FIG. 1.

FIG. 4 illustrates a cross-sectional view of an intermediate stage of manufacturing the integrated circuit package after forming the compressive molding compound.

Referring to FIG. 4, the adhesive material 202 and carrier 204 are removed by heating the apparatus to a thermal release temperature, e.g., a temperature ranging from about 175° C. to about 260° C. In a preferred embodiment, the apparatus is heated to a temperature of about 260° C.

Figure 5:
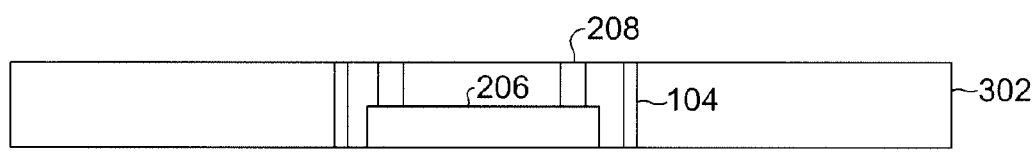
FIG. 5 illustrates a cross-sectional view of an intermediate stage of manufacturing the integrated circuit package of FIG. 1.

FIG. 5 illustrates a cross-sectional view of an intermediate stage of manufacturing the integrated circuit package after forming the compressive molding compound.

Referring to FIG. 5, an upper and lower portion of the compressive molding compound 302 is removed. Removing these portions may be accomplished with grinding and/or polishing procedures as known in the art such as wheel silicon grinding. In a preferred embodiment, the compressive molding on the lower surface is grinded to remove the first portion 102 of the lead frame 100, e.g., about 115 µm of the first portion 102. The upper surface of the compressive molding compound 302 is removed to expose a surface of the interconnect 208 and the second portion 104 of the lead frame 100.

Figure 6:
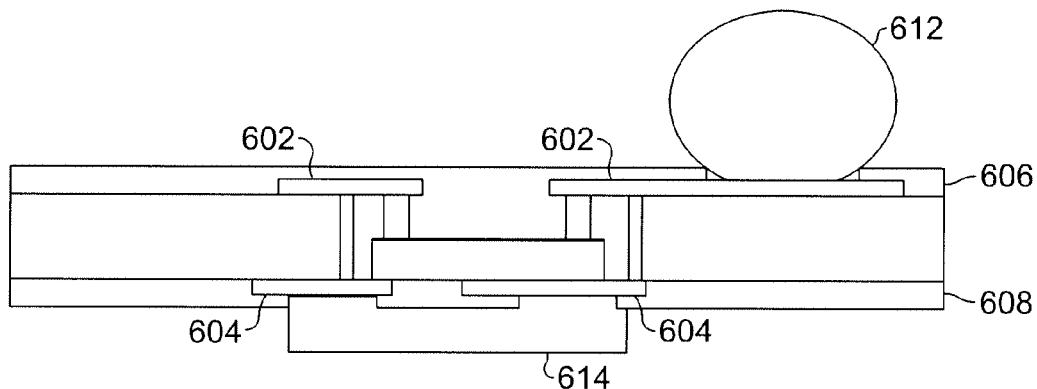
FIG. 6 illustrates a completed integrated circuit package.

FIG. 6 illustrates a completed integrated circuit package.

Referring to FIG. 6, a first metallization layer is formed on a first surface of the compressive molding 302. A second metallization layer is formed on a second surface of the compressive molding 302. The first and second metallization layers are formed of conductive material to a thickness ranging from about 3 µm to about 10 µm via chemical vapor deposition, physical vapor deposition, and the like. The first metallization layer is etched to form interconnect traces 602. The second metallization layer is etched to form interconnect traces 604. The first and second metallization layers may be faulted of different materials. In a preferred embodiment, the first and second metallization layers consist of copper, aluminum, gold, or alloys thereof.

A first passivation layer 606 is formed on the interconnect traces 602 and a second passivation layer 608 is formed on the interconnect traces 604. The first passivation layer 606 is etched to form a contact hole 610. The first and second passivation layers are formed of insulative material via polymers, e.g., photosensitive liquid polymers. The insulating materials may include parylene, polyimide, benzocyclobutene (BCB), polybenzoxazole. (PBO), combinations thereof, and the like. The first and second passivation layers may be formed of different materials. A solder ball 612 is formed in the contact hole 610. The solder ball 612 is formed from conventional processes and may include a conductive material, such as silver, copper, tin, combinations thereof, and the like. Components 614, such as passive or active components including, for example, capacitors, resistors, transistors, inductors, combinations thereof, and the like, are attached to the interconnect traces 604.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of forming an integrated circuit package comprising:

forming a lead frame comprising a first portion and a second portion, wherein the first portion and the second portion intersect at an angle ranging from 45 degrees to 135 degrees;

forming an adhesive material on the first portion of the lead frame;

attaching a carrier to the lead frame with the adhesive material;

attaching an integrated circuit to the adhesive material;

forming an interconnect on the integrated circuit;

forming a protective material on the integrated circuit;

removing the carrier and the adhesive material;

removing a portion of the protective material to expose the interconnect and the second portion of the lead frame; and removing the first portion of the lead frame.

2. The method of claim 1, wherein the angle is in the range from 85 degrees to 95 degrees.

3. The method of claim 1, wherein forming the protective layer comprises heating an epoxy material to a temperature in the range from 120° C. to 150° C. to harden the epoxy material.

4. The method of claim 3, wherein removing the carrier and the adhesive material comprises heating the epoxy material to a temperature from 175° C. to 260° C. to thermally release the adhesive material and carrier.

5. The method of claim 1, wherein removing the portion of the protective material comprises grinding an upper surface thereof.

6. The method of claim 1, further comprising:
forming a conductive material on the protective layer;
forming a passivation layer on the conductive material; and
forming a solder ball on the passivation layer, wherein the solder ball is electrically coupled to the conductive material.

7. A method of making an integrated circuit package comprising:
forming a lead frame comprising a first portion and a second portion, wherein the first portion and the second portion intersect at an angle ranging from 45 degrees to 135 degrees;
adhering a double-sided thermal tape to a bottom surface of the first portion of the lead frame;
attaching a carrier to the lead frame with the double-sided thermal tape;
attaching an integrated circuit to the double-sided thermal tape adjacent to the first portion of the lead frame;
forming at least one pillar interconnect on the integrated circuit;
forming a compressive compound over the integrated circuit and the first and second portions of the lead frame;
hardening the compressive compound by heating the compressive compound to a temperature in the range from 120° C. to 150° C.;
removing a portion of the compressive compound to expose the at least one pillar interconnect and the second portion of the lead frame; and
removing the first portion of the lead frame.

8. The method of claim 7, wherein the removing the portion of compressive compound comprises grinding an upper surface thereof.

9. The method of claim 8, further comprising:
forming a conductive material on the compressive compound;
forming a first passivation layer on an upper surface of the conductive material;
forming a second passivation layer on a lower surface of the compressive compound; and
forming a solder ball on the first passivation layer, wherein the solder ball is electrically coupled to the conductive material.

10. The method of claim 7, wherein the compressive compound comprises an epoxy material.

11. The method of claim 7, further comprising attaching a component to the lower surface of the compressive compound.

12. A method of forming an integrated circuit package comprising:
forming a lead frame comprising a first portion and a second portion transverse to the first portion;
forming an adhesive material on the first portion of the lead frame;
attaching a carrier to the lead frame with the adhesive material;
attaching an integrated circuit to the adhesive material;
forming an interconnect on the integrated circuit;
forming a protective material on the integrated circuit;
removing the carrier and the adhesive material;
removing a portion of the protective material to expose the interconnect and the second portion of the lead frame; and
removing the first portion of the lead frame.

13. The method of claim 12, wherein forming the protective material comprises heating an epoxy material to a temperature in the range from 120° C. to 150° C. to harden the epoxy material.

14. The method of claim 13, wherein removing the carrier and the adhesive material comprises heating the epoxy material to a temperature from 175° C. to 260° C. to thermally release the adhesive material and carrier.

15. The method of claim 12, wherein removing the portion of the protective material comprises grinding an upper surface thereof.

16. The method of claim 12 further comprising:
forming a conductive material on the protective material;
forming a passivation layer on the conductive material; and
forming a solder ball on the passivation layer, wherein the solder ball is electrically coupled to the conductive material.

* * * * *